(12) United States Patent
Yang et al.

(10) Patent No.: US 11,635,403 B2
(45) Date of Patent: Apr. 25, 2023

(54) METHOD FOR MEASURING SEMICONDUCTOR GAS SENSOR BASED ON VIRTUAL ALTERNATING CURRENT IMPEDANCE

(71) Applicant: XI'AN JIAOTONG UNIVERSITY, Shaanxi (CN)

(72) Inventors: Aijun Yang, Shaanxi (CN); Dawei Wang, Shaanxi (CN); Xiaohua Wang, Shaanxi (CN); Mingzhe Rong, Shaanxi (CN); Jianbin Pan, Shaanxi (CN); Xianbo Huang, Shaanxi (CN); Jifeng Chu, Shaanxi (CN); Huan Yuan, Shaanxi (CN)

(73) Assignee: XI'AN JIAOTONG UNIVERSITY, Xi'an (CN)

( * ) Notice: Subject to any disclaimer, the term of this patent is extended or adjusted under 35 U.S.C. 154(b) by 44 days.

(21) Appl. No.: 17/317,866

(22) Filed: May 11, 2021

(65) Prior Publication Data
US 2022/0178866 A1    Jun. 9, 2022

(30) Foreign Application Priority Data
Dec. 4, 2020    (CN) .......................... 202011416060.3

(51) Int. Cl.
*G01N 27/22* (2006.01)

(52) U.S. Cl.
CPC ................................. *G01N 27/228* (2013.01)

(58) Field of Classification Search
CPC ..... G01N 27/228; G01N 27/12; G01N 27/028; G01R 27/2605
See application file for complete search history.

(56) References Cited

U.S. PATENT DOCUMENTS

2006/0102476 A1 * 5/2006 Niwa ................. G01N 27/4067
204/421

FOREIGN PATENT DOCUMENTS

| CN | 110573871 A | * | 12/2019 | ............ F01N 11/007 |
| EP | 2154520 A1 | * | 2/2010 | ............. G01N 27/12 |

\* cited by examiner

*Primary Examiner* — Alexander Satanovsky
*Assistant Examiner* — Asm Fakhruddin
(74) *Attorney, Agent, or Firm* — Dragon Sun Law Firm, PC; Nathaniel Perkins

(57) ABSTRACT

The invention discloses a method for measuring a semiconductor gas sensor based on virtual alternating current impedance. The method comprises: combining measurement parameters of virtual measurement frequencies in a first predetermined range and virtual parallel capacitance values in a second predetermined range, and measuring gas with known concentrations at each characteristic quantity among nine characteristic quantities in the case of each combination; obtaining multiple characteristic values corresponding to the same gas concentration at each characteristic quantity after traversing all parameter combinations and all nine characteristic quantities; and selecting virtual measurement frequencies in a third range, virtual parallel capacitance values in a fourth range and one or several corresponding characteristic quantities as the finally selected measurement parameters for measuring the unknown gas concentration.

5 Claims, 6 Drawing Sheets

METHOD FOR MEASURING SEMICONDUCTOR GAS SENSOR BASED ON VIRTUAL ALTERNATING CURRENT IMPEDANCE

CROSS-REFERENCE TO RELATED APPLICATION

The present application is filed based on and claims priority to Chinese patent application No. CN 2020114160603 filed on Dec. 4, 2020, which is incorporated herein by reference in its entirety.

TECHNICAL FIELD

The invention belongs to the field of semiconductor gas sensor testing, and particularly discloses a method for measuring a semiconductor gas sensor based on virtual alternating current impedance.

BACKGROUND

Semiconductor gas sensors have attracted much attention due to the advantages such as low cost, high sensitivity and small size. However, problems such as poor reliability, severe baseline drift and output nonlinearity hinder wide application of the semiconductor gas sensors. The measuring method based on alternating current impedance effectively solves the problems of output nonlinearity, severe baseline drift and the like of the semiconductor gas sensors. Yet, the measuring method based on alternating current impedance has the problems of high hardware cost and complex system mainly due to the fact that alternating current measurement is more complicated and expensive than direct current measurement.

The above information disclosed in the background is only used to enhance the understanding of the background of the present invention, and therefore may contain information that does not constitute the prior art that is already known to those of ordinary skill in the art in this country.

SUMMARY

In view of the problems of high hardware cost and complex system of measurement methods for semiconductor gas sensors based on alternating current impedance in the prior art, the present invention provides a method for measuring a semiconductor gas sensor based on virtual alternating current impedance. The method is simple and feasible, and replaces alternating current measurement with direct current measurement on the premise that the advantages of high output linearity and enhanced baseline stability achieved by the alternating current impedance measurement method can be realized, so that the cost and system complexity are significantly lowered.

The purpose of the present invention is achieved through the following technical solutions. A method for measuring a semiconductor gas sensor based on virtual alternating current impedance comprises the following steps:

first step, measuring the resistance value of a semiconductor gas sensor exposed to a series of to-be-measured gases with known concentrations, second step, connecting the resistance value with virtual capacitance C in parallel and calculating corresponding virtual impedance characteristic quantities by the following alternating current impedance formulas:

$$Z_1 = \frac{R}{1+(2\pi fCR)^2}, Z_2 = \frac{-R^2 C 2\pi f}{1+(2\pi fCR)^2}, Z = \sqrt{Z_1^2 + Z_2^2},$$

$$\text{phase} = \arctan\left(\frac{Z_2}{Z_1}\right), P = \frac{1}{\text{phase}}, Y = \frac{1}{Z}, Y_1 = \frac{1}{Z_1},$$

$$Y_2 = \frac{1}{Z_2}, G = \frac{Z_1}{Z_1^2 + Z_2^2},$$

wherein f represents the virtual alternating current measurement frequency, R represents the measured resistance value, and the meaning of the virtual impedance characteristic quantities is as follows: Y: calculated virtual admittance modulus, G: calculated real component modulus of the virtual admittance, Z: calculated virtual impedance modulus, $Z_1$: calculated real component modulus of the virtual impedance, $Z_2$: calculated imaginary component modulus of the virtual impedance, reciprocal of the calculated real component modulus of the virtual impedance, $Y_2$: reciprocal of the imaginary component modulus of the virtual impedance, phase: calculated virtual phase, and P: reciprocal of the calculated virtual phase;

combining measurement parameters of virtual frequencies in a first predetermined range and virtual parallel capacitance values in a second predetermined range, and measuring a certain type of gas with known concentration at each virtual impedance characteristic quantity among the above nine virtual impedance characteristic quantities in the case of each combination;

obtaining a characteristic value corresponding to the known concentration at a certain virtual impedance characteristic quantity among the currently selected nine virtual impedance characteristic quantities at the end of each time of measurement;

obtaining multiple characteristic values corresponding to the same gas concentration at each virtual impedance characteristic quantity after traversing all parameter combinations and all nine virtual impedance characteristic quantities;

when considering the linearity and the signal-to-noise ratio between each characteristic value at all virtual impedance characteristic quantities and the known concentration, and making the linearity greater than or equal to a first threshold and the signal-to-noise ratio greater than or equal to a second threshold:

selecting a frequency range composed of corresponding virtual frequency values as a third range of measurement frequencies, wherein the lower limit of the third range is the minimum frequency among the corresponding virtual frequency values, and the upper limit of the third range is the maximum frequency among the corresponding virtual frequency values, and selecting a capacitance range composed of corresponding virtual parallel capacitance values as a fourth range of parallel capacitance values, wherein the lower limit of the fourth range is the minimum capacitance value among the corresponding virtual parallel capacitance values, and the upper limit of the fourth range is the maximum capacitance value among the corresponding virtual parallel capacitance values, selecting one or several corresponding virtual impedance characteristic quantities, and taking the selected virtual measurement frequencies in the third range, the selected virtual parallel capacitance values in the fourth range and the selected one or several corresponding virtual impedance characteristic quantities as the finally selected measurement parameters for measuring the unknown gas concentration; and third step, measuring the type of gas with unknown concentration based on the measurement parameters.

According to the method, the step of considering the linearity and the signal-to-noise ratio between each characteristic value at all virtual impedance characteristic quantities and the known concentration, and making the linearity greater than or equal to a first threshold and the signal-to-noise ratio greater than or equal to a second threshold comprises the conditions:

1) firstly selecting all the characteristic values with the linearity being greater than or equal to the first threshold, and each corresponding virtual impedance characteristic quantity; and then further selecting those characteristic values with the signal-to-noise ratio being greater than or equal to the second threshold from all the characteristic values, and each corresponding virtual impedance characteristic quantity; or 2) firstly selecting all the characteristic values with the signal-to-noise ratio being greater than or equal to the second threshold, and each corresponding virtual impedance characteristic quantity; and then further selecting those characteristic values with the linearity being greater than or equal to the first threshold from all the characteristic values, and each corresponding virtual impedance characteristic quantity.

According to the method, in the first step, the semiconductor gas sensor comprises a metal oxide gas sensor or a semiconductor gas sensor prepared based on dielectric polymers, conductive polymers, nanotubes, metal organic frameworks, graphene and supramolecular compounds.

According to the method, in the second step, the first predetermined range comprises real numbers greater than zero, and the second predetermined range comprises real numbers greater than zero.

According to the method, in the second step, the first predetermined range is 1 Hz to 10 MHz, and the second predetermined range is 1 pF to 1 uF.

According to the method, in the second step, the measurement accuracy is further investigated as another dimension for finally selected measurement parameters for measuring the unknown gas concentration.

According to the method, a strategy for determining the measurement parameters represented by the virtual measurement frequencies in the third range, the virtual parallel capacitance values in the fourth range and the virtual impedance characteristic quantities is: firstly, selecting characteristic values with the linearity being greater than or equal to the first threshold, and then filtering out those characteristic values with the signal-to-noise ratio being greater than or equal to the second threshold and the corresponding virtual impedance characteristic quantities, selecting a frequency range composed of frequency values corresponding to the finally selected characteristic values as the third range of virtual measurement frequencies, and selecting a capacitance range composed of virtual parallel capacitance values corresponding to the finally selected characteristic values as a fourth range of parallel capacitance values, selecting one or several corresponding virtual impedance characteristic quantities, and taking the selected virtual measurement frequencies in the third range, the selected virtual parallel capacitance values in the fourth range and the selected one or several corresponding virtual impedance characteristic quantities as the finally selected measurement parameters for measuring the unknown gas concentration;

according to the method, another strategy for determining the measurement parameters represented by the virtual measurement frequencies in the third range, the virtual parallel capacitance values in the fourth range and the virtual impedance characteristic quantities is:

firstly, selecting the characteristic values with the signal-to-noise ratio being greater than or equal to the second threshold, and then filtering out those characteristic values with the linearity being greater than or equal to the first threshold and the corresponding characteristic quantities, and selecting a frequency range composed of frequency values corresponding to the finally selected characteristic values as the third range of virtual measurement frequencies, selecting a capacitance range composed of virtual parallel capacitance values corresponding to the finally selected characteristic values as the fourth range of virtual parallel capacitance values, selecting one or several corresponding virtual impedance characteristic quantities, and taking the selected virtual measurement frequencies in the third range, the selected virtual parallel capacitance values in the fourth range and the selected one or several corresponding virtual impedance characteristic quantities as the finally selected measurement parameters for measuring the unknown gas concentration.

Beneficial Effects the measurement method of the present invention can significantly increase the output linearity, signal-to-noise ratio, baseline stability, measurement concentration range and recovery speed of the semiconductor gas sensor during gas measurement by determining virtual measurement parameters, achieves the effect similar to that achieved by a method based on alternating current impedance. Meanwhile, the cost and complexity of the test system are significantly lowered.

The above description is only an overview of the technical solutions of the present invention. In order to make the technical means of the present invention clearer, to the extent that those skilled in the art can implement the present invention in accordance with the content of the description, and to make the above and other objectives, characteristics and advantages of the present invention more obvious and understandable, the specific embodiments of the present invention are taken as examples for illustration below.

BRIEF DESCRIPTION OF THE DRAWINGS

By reading the detailed description of the preferred embodiments below, other various advantages and benefits of the present invention will become clear to those of ordinary skill in the art. The accompanying drawings in the description are only used for the purpose of illustrating the preferred embodiments, and are not considered as a limitation on the present invention. Obviously, the accompanying drawings described below are only some embodiments of the present invention. Those of ordinary skill in the art can obtain other accompanying drawings based on these accompanying drawings without creative work. Besides, the same reference numerals are used to denote the same components in all the accompanying drawings.

Wherein.

The present invention will be further explained below in conjunction with the accompanying drawings and embodiments.

DETAILED DESCRIPTION

Specific embodiments of the present invention will be described in more detail with reference to FIGS. 1 to 6 below. Although specific embodiments of the present invention are shown in the accompanying drawings, it should be understood that the present invention can be implemented in various forms and should not be limited by the embodiments disclosed herein. On the contrary, these embodiments are provided to enable a more thorough understanding of the present invention and to fully convey the scope of the present invention to those skilled in the art.

It should be noted that certain words are used in the description and claims to refer to specific components. Those skilled in the art should understand that they may use different terms to refer to the same component. The description and claims do not distinguish components by differences in terms, but by differences in functions of components. If □comprise" or □comprising□ mentioned in the entire description and claims is an open term, it should be interpreted as □comprising but not limited to□. The preferred embodiments for implementing the present invention are described in the following of the description, but the description is based on the general principles of the description and is not intended to limit the scope of the present invention. The protection scope of the present invention is defined by the appended claims.

In order to facilitate the understanding of the embodiments of the present invention, specific embodiments will be taken as an example for further explanation and description in conjunction with the accompanying drawings, and the accompanying drawings do not constitute a limitation on the embodiments of the present invention.

Figure 1:
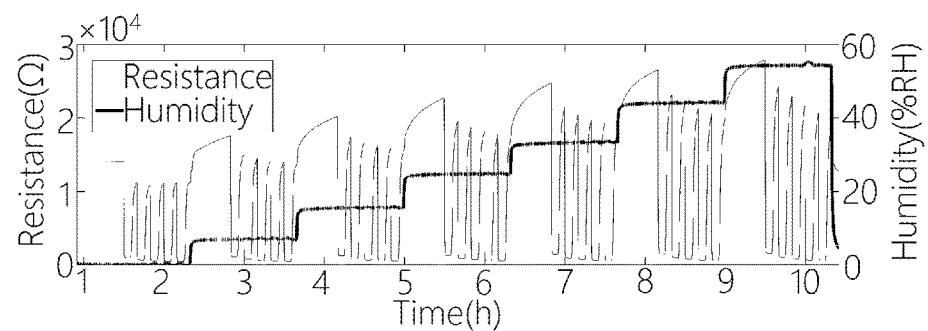
FIG. 1 shows the results of measuring acetone gas through a commercial semiconductor gas sensor TGS2602 sold by Figaro Sensing Technology (Shanghai) Co., Ltd. with the acetone concentration of 0-200 ppm (the test concentration points are: 0 ppm, 40 ppm, 80 ppm, 120 ppm, 160 ppm and 200 ppm, respectively), the background gas of air, the temperature of 28 DEG C. and the humidity of 0-60% RH.
Figure 2A:
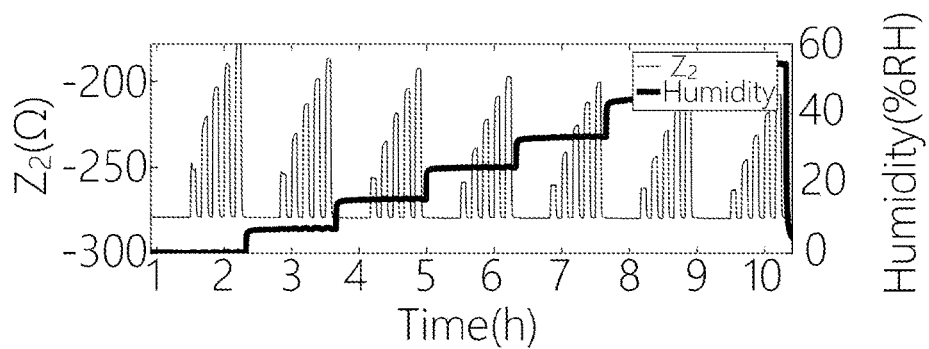
FIGS. 2(a)-2(b) show the measurement result curves when an alternating current impedance characteristic $Z_2$ is output as the sensor reading, the upper figure shows the result of an alternating current impedance method, the lower figure shows the measurement result of a virtual alternating current impedance method provided by the present invention, and the results are highly similar, compared with FIG. 1 with resistance being output as the sensor reading, the output linearity, baseline stability and response recovery speed are significantly improved, the measurement conditions are the same as those in FIG. 1, wherein the virtual parallel capacitance value is 100 pF and the virtual measurement frequency is 5 MHz in the virtual alternating current impedance method.
Figure 2B:
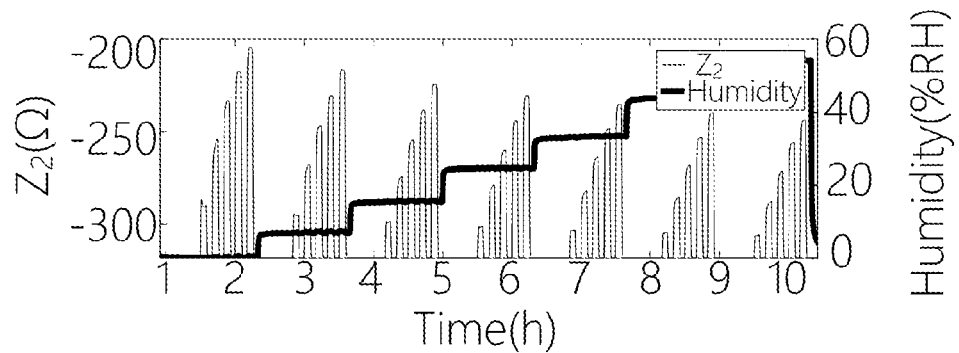
Figure 3A:
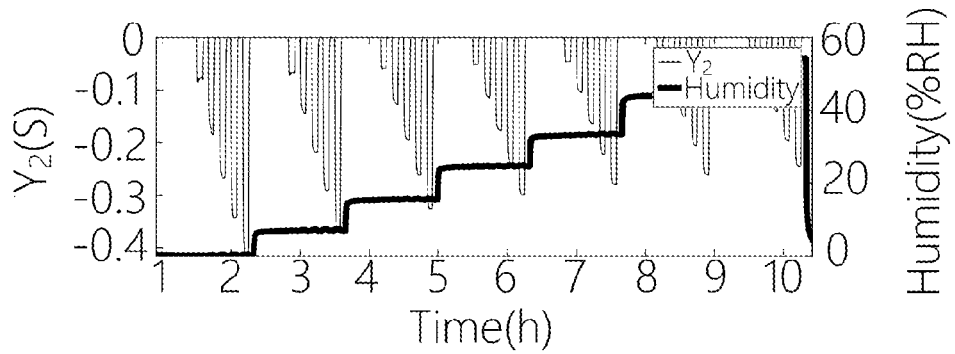
FIGS. 3(a)-3(b) show the measurement result curves when an alternating current impedance characteristic $Y_2$ is output as the sensor reading, the upper figure shows the result of an alternating current impedance method, and the lower figure shows the measurement result of a virtual alternating current impedance method provided by the present invention, and the results are highly similar, compared with FIG. 1 with resistance being output as the sensor reading, the output linearity, baseline stability and response recovery speed are significantly improved, the measurement conditions are the same as those in FIG. 1, wherein the virtual parallel capacitance value is 100 pF and the virtual measurement frequency is 20 kHz in the virtual alternating current impedance method.
Figure 3B:
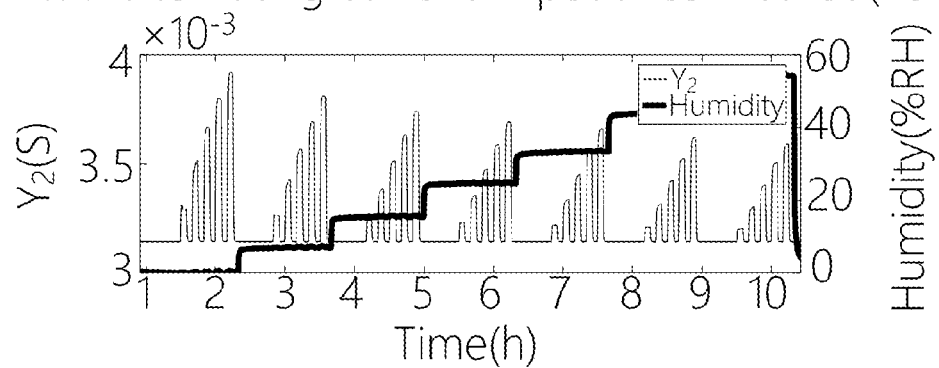
Figure 4A:
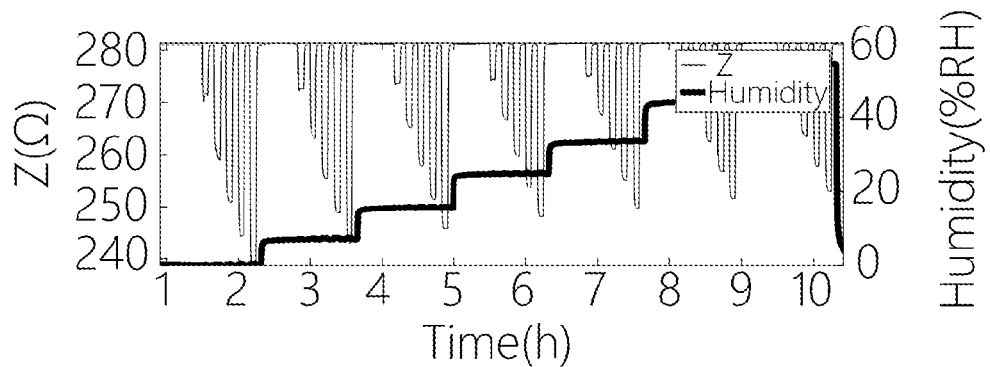
FIGS. 4(a)-4(b) show measurement result curves when an alternating current impedance characteristic Z is output as the sensor reading, the upper figure shows the result of an alternating current impedance method, the lower figure shows the measurement result of a virtual alternating current impedance method provided by the present invention, and the results are highly similar, compared with FIG. 1 with resistance being output as the sensor reading, the output linearity, baseline stability and response recovery speed are significantly improved, the measurement conditions are the same as those in FIG. 1, wherein the virtual parallel capacitance value is 100 pF and the virtual measurement frequency is 5 MHz in the virtual alternating current impedance method.
Figure 4B:
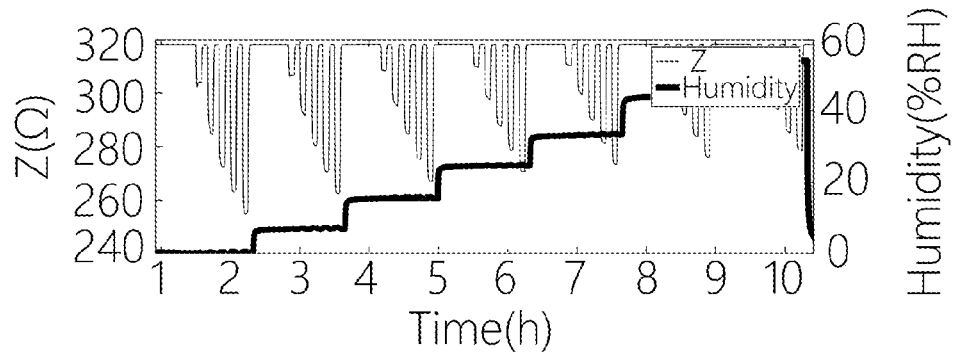
Figure 5A:
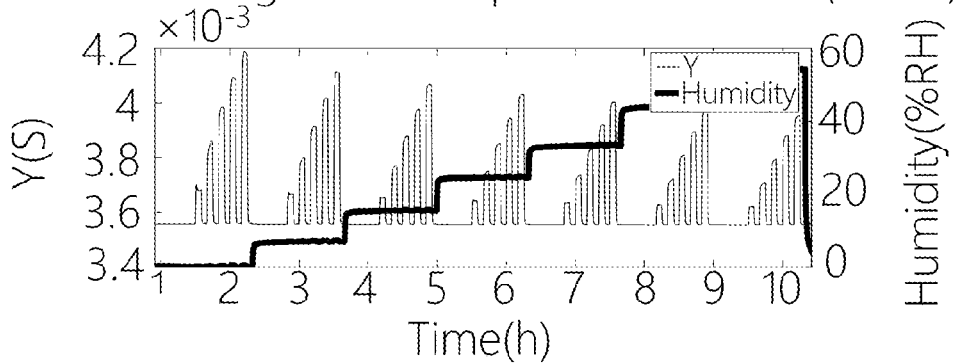
FIGS. 5(a)-5(b) show measurement result curves when an alternating current impedance characteristic Y is output as the sensor reading, the upper figure shows the result of an alternating current impedance method, the lower figure shows the measurement result of a virtual alternating current impedance method provided by the present invention, and the results are highly similar, compared with FIG. 1 with resistance being output as the sensor reading, the output linearity, baseline stability and response recovery speed are significantly improved, the measurement conditions are the same as those in FIG. 1, wherein the virtual parallel capacitance value is 100 pF and the virtual measurement frequency is 5 MHz in the virtual alternating current impedance method.
Figure 5B:
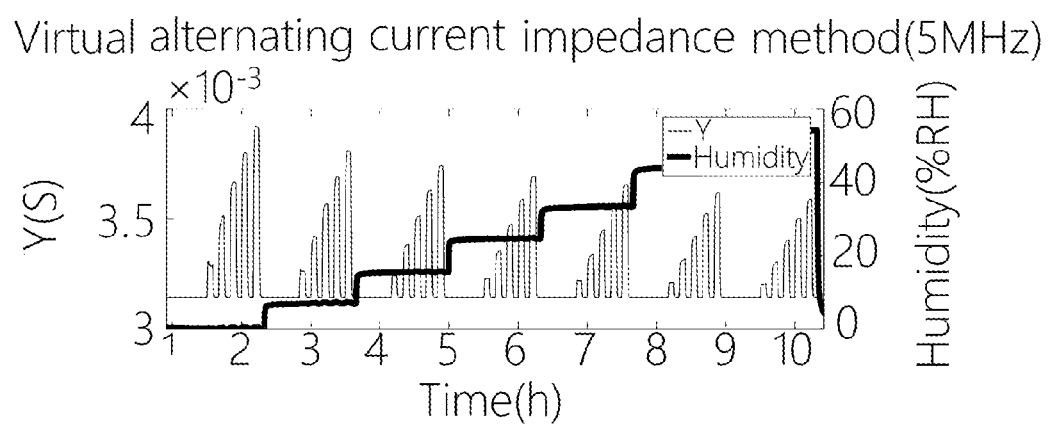
Figure 6:
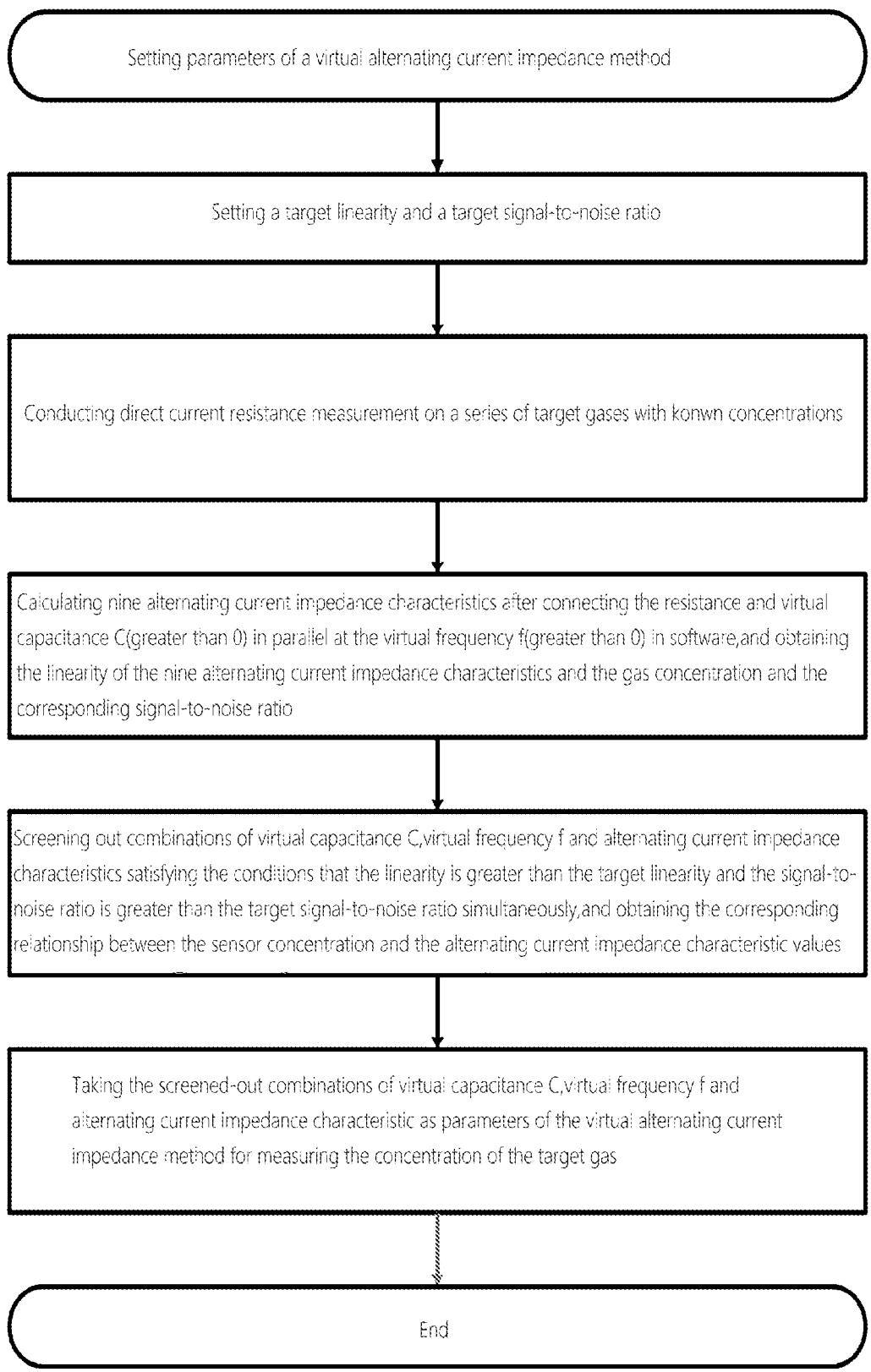
FIG. 6 shows a schematic diagram of a method for measuring a semiconductor gas sensor based on virtual alternating current impedance.

As shown in FIG. 6, a method for measuring a semiconductor gas sensor based on virtual alternating current impedance comprises the following steps:

first step, measuring resistance of a semiconductor gas sensor exposed to a series of to-be-measured gases with known concentrations through a resistance measuring device, wherein the requirement on the resistance measuring device is that measurement noise is as low as possible, and the typical value is less than +/−0.5%;

second step, connecting the resistance value measured in the first step with virtual capacitance C in parallel in a software program, and calculating corresponding virtual impedance characteristic quantities by the following alternating current impedance formulas:

$$Z_1 = \frac{R}{1 + (2\pi fCR)^2}$$

$$Z_2 = \frac{-R^2 C 2\pi f}{1 + (2\pi fCR)^2}$$

$$Z = \sqrt{Z_1^2 + Z_2^2}$$

$$\text{phase} = \arctan\left(\frac{Z_2}{Z_1}\right)$$

$$P = \frac{1}{\text{phase}}$$

$$Y = \frac{1}{Z}$$

-continued $$Y_1 = \frac{1}{Z_1}$$

$$Y_2 = \frac{1}{Z_2}$$

$$G = \frac{Z_1}{Z_1^2 + Z_2^2}$$

in the above formulas, f represents the program virtual alternating current measurement frequency, R represents the measured sensor resistance value, and the meaning of the virtual impedance characteristics is as follows:

Y: the virtual admittance modulus calculated in the program,

G: the real component modulus of the virtual admittance calculated in the program, Z: the virtual impedance modulus calculated in the program, $Z_1$: the real component modulus of the virtual impedance calculated in the program, $Z_2$: the imaginary component modulus of the virtual impedance calculated in the program, $Y_1$: the reciprocal of the real component modulus of the virtual impedance calculated in the program, $Y_2$: the reciprocal of the imaginary component modulus of the virtual impedance calculated in the program, phase: the virtual phase calculated in the program, P: the reciprocal of the virtual phase calculated in the program;

combining measurement parameters of virtual measurement frequencies in a first predetermined range and virtual parallel capacitance values in a second predetermined range, and obtaining multiple characteristic values corresponding to the same gas concentration at each characteristic quantity after traversing all parameter combinations and all nine characteristic quantities;

when considering the linearity and the signal-to-noise ratio between each characteristic value at all characteristic quantities and the known concentration, and making the linearity greater than or equal to a first threshold and the signal-to-noise ratio greater than or equal to a second threshold:

selecting a frequency range composed of corresponding virtual frequency values as a third range of measurement frequencies, wherein the lower limit of the third range is the minimum frequency among the corresponding virtual frequency values, and the upper limit of the third range is the maximum frequency among the corresponding virtual frequencies, and selecting a capacitance range composed of corresponding virtual parallel capacitance values as a fourth range of parallel capacitance values, wherein the lower limit of the fourth range is the minimum capacitance value among the corresponding virtual parallel capacitance values, and the upper limit of the fourth range is the maximum capacitance value among the corresponding virtual parallel capacitance values, selecting one or several corresponding characteristic quantities, and taking the selected virtual measurement frequencies in the third range, the selected virtual parallel capacitance values in the fourth range and the selected one or several corresponding characteristic quantities as the finally selected virtual measurement parameters for measuring the unknown gas concentration; and third step, measuring the type of gas with unknown concentration by the mode of measuring the resistance, and calculating the concentration of the gas in a software program based on the virtual measurement parameters.

According to the preferred embodiment of the method, the step of considering the linearity and the signal-to-noise ratio between each characteristic value at all characteristic quantities and the gas with the known concentration, and making the linearity greater than or equal to a first threshold and the signal-to-noise ratio greater than or equal to a second threshold comprises the steps:

1) firstly selecting all the characteristic values with the linearity being greater than or equal to the first threshold, and each corresponding characteristic quantity; and then further selecting those characteristic values with the signal-to-noise ratio being greater than or equal to the second threshold from all the characteristic values, and each corresponding characteristic quantity; or 2) firstly selecting all the characteristic values with the signal-to-noise ratio being greater than or equal to the second threshold, and each corresponding characteristic quantity; and then further selecting those characteristic values with the linearity being greater than or equal to the first threshold from all the characteristic values, and each corresponding characteristic quantity.

According to the method, in the first step, the semiconductor gas sensor may need to be connected with a heater voltage, and the semiconductor gas sensor comprises a metal oxide gas sensor.

According to the method, in the first step, the resistance measuring device comprises a multimeter, a source meter, an electric bridge, and other devices or chips with resistance measurement functions.

According to the method, in the second step, the first predetermined range is 1 uHz to 100 MHz, and the second predetermined range is 1 pF to 1 uF.

In the preferred embodiment of the method, a strategy for determining the measurement parameters represented by the virtual measurement frequencies in the third range, the virtual parallel capacitance values in the fourth range and the characteristic quantities is: firstly, selecting the characteristic values with the linearity being greater than or equal to the first threshold, and then filtering out those characteristic values with the signal-to-noise ratio being greater than or equal to the second threshold and the corresponding characteristic quantities, and:

selecting a frequency range composed of virtual frequency values corresponding to the finally selected characteristic values as the third range of measurement frequencies, and selecting a capacitance range composed of virtual parallel capacitance values corresponding to the finally selected characteristic values as the fourth range of parallel capacitance values, and selecting one or several corresponding characteristic quantities, and taking the selected measurement frequencies in the third range, the selected parallel capacitance values in the fourth range and the selected one or several corresponding characteristic quantities as the finally selected measurement parameters for measuring the unknown gas concentration.

In the preferred embodiment of the method, another strategy for determining the measurement parameters represented by the virtual measurement frequencies in the third range, the virtual parallel capacitance values in the fourth range and the characteristic quantities is:

firstly, selecting the characteristic values with the signal-to-noise ratio being greater than or equal to the second threshold, and then filtering out those characteristic values with the linearity being greater than or equal to the first threshold and the corresponding characteristic quantities, and selecting a frequency range composed of virtual frequency values corresponding to the finally selected characteristic values as the third range of measurement frequencies, selecting a capacitance range composed of virtual parallel capacitance values corresponding to the finally selected characteristic values as the fourth range of parallel capacitance values, selecting one or several corresponding characteristic quantities, and taking the selected virtual measurement frequencies in the third range, the selected virtual parallel capacitance values in the fourth range and the selected one or several corresponding characteristic quantities as the finally selected measurement parameters for measuring the unknown gas concentration.

To further understand the present invention, see the following examples.

Embodiment 1

The method comprises:

Step 1, taking metal oxide gas sensors TGS2602 and acetone as examples in the embodiment, adopting an IM3570 impedance analyzer as alternating current impedance measurement equipment, adopting a source meter 2612B as a resistance measuring device, and adopting a 0805 chip capacitor as a parallel capacitor with the candidate (virtual) capacitance values of 0 pF, 10 pF, 100 pF and 1 nF. For the embodiment, capacitance values between 0 pF and 1 nF can meet the measurement requirements. For other situations, it may be necessary to choose more capacitance values between 0 pF and 100 uF for experimentation.

Step 2, connecting the impedance analyzer IM3570 to one of the TGS2602 sensor and the parallel capacitor, and connecting the other TGS2602 to the source meter 2612B.

Step 3, taking a 100 pF (virtual) parallel capacitor as an example, and repeating the following process for different parallel capacitance values:

placing a TGS2602 sensor circuit board in step 1 into a gas measurement chamber while keeping an equivalent circuit in step 2 being connected, setting the volume of the air chamber as 300 ml, introducing air as the background gas, keeping the temperature stable at 28 DEG C. and the gas introduction flow rate at 1000 ml/min, starting to introduce acetone standard gas after the TGS2602 sensor is fully aged and stable, and conducting gas introduction in the mode of alternately inputting acetone standard gas and background gas for 5 minutes each with the acetone standard gas concentration values of 40 ppm, 80 ppm, 120 ppm, 160 ppm and 200 ppm. Meanwhile, setting the IM3570 impedance analyzer to a continuous frequency scanning mode to scan 45 frequency points every 5 seconds, and keeping the frequency range at 1000 Hz-5 MHz for continuous measurement;

processing data collected by the impedance analyzer IM3570 to obtain different parallel capacitance values and 9 impedance characteristic quantities as the gas concentration-measurement characteristic linearity relationship of measurement characteristics at different measuring frequencies, and filtering out combinations of parallel capacitance value-impedance characteristic-measurement frequency with the absolute value of the linearity coefficient $|R^2|$ being greater than 0.99, wherein it is found that among the 9 impedance characteristics, only when 4 impedance characteristics of Y, $Y_2$, Z and $Z_2$ are used as measurement characteristics, it is possible that the absolute value of linearity coefficient $|R^2|$ is greater than 0.99, and the combination of measurement parameters at this time is as follows: the absolute value of the linearity coefficient at gas concentration-measurement characteristic with the parallel capacitance of 100 pF and the measurement frequency of 5 MHz at the impedance characteristic Y is greater than 0.99; the absolute value of the linearity coefficient at gas concentration-measurement characteristic with the parallel capacitance of 100 pF and the measurement frequency of 20 kHz at the impedance characteristic $Y_2$ is greater than 0.9994; the absolute value of the linearity coefficient at gas concentration-measurement characteristic with the parallel capacitance of 100 pF and the measurement frequency of 5 MHz at the impedance characteristic Z is greater than 0.99; and the absolute value of the linearity coefficient at gas concentration-measurement characteristic with the parallel capacitance of 100 pF and the measurement frequency of 5 MHz at the impedance characteristic $Z_2$ is greater than 0.99;

connecting the resistance data obtained from the source meter 2612B with the virtual parallel capacitance in program software, and calculating the impedance characteristics and the gas concentration-measurement characteristic linearity relationship at different virtual alternating current frequencies, and filtering out combinations of parallel capacitance-impedance characteristic-measurement frequency with the absolute value of the linearity coefficient $|R^2|$ being greater than 0.99, wherein it is found that these characteristic combinations are mostly overlapped with those obtained by the impedance analyzer IM3570; and drawing the results of an alternating current impedance method performed by the impedance analyzer IM3570 and the results of a virtual alternating current impedance method performed by the source meter 2612B, as shown in FIGS. 1 to 5, wherein the results of the virtual alternating current impedance method are highly similar to these of the alternating current impedance method, which proves that the experimental alternating current impedance method can be replaced by the method of measuring resistance and then virtually calculating the alternating current impedance characteristic through the program software, namely the virtual alternating current impedance method provided by the present invention. It can be seen that the virtual alternating current impedance method of the present invention almost perfectly maintains the advantages of high linear output and stable baseline of the alternating current impedance method, while the virtual alternating current impedance method measures resistance, therefore the cost and system complexity are significantly lower than those of the alternating current impedance method, and the virtual alternating current impedance method has higher practical application value.

Although the embodiments of the present invention are described above with reference to the accompanying drawings, the present invention is not limited to the above specific embodiments and application fields. The above specific embodiments are only illustrative and instructive, and not restrictive. Under the enlightenment of this description and without departing from the scope of protection of the claims of the present invention, those of ordinary skill in the art can further make many forms of embodiments, which all fall within the protection scope of the present invention.

The invention claimed is:

1. A method for measuring a semiconductor gas sensor based on virtual alternating current impedance, comprising the following steps:
    first step, measuring a resistance value of a semiconductor gas sensor exposed to a series of to-be-measured gases with known concentrations,
    second step, connecting the resistance value with virtual capacitance C in parallel and calculating corresponding virtual impedance characteristic quantities by the following alternating current impedance formulas:

$$Z_1 = \frac{R}{1+(2\pi fCR)^2}, Z_2 = \frac{-R^2 C 2\pi f}{1+(2\pi fCR)^2}, Z = \sqrt{Z_1^2 + Z_2^2},$$

$$\text{phase} = \arctan\left(\frac{Z_2}{Z_1}\right), P = \frac{1}{\text{phase}}, Y = \frac{1}{Z}, Y_1 = \frac{1}{Z_1},$$

$$Y_2 = \frac{1}{Z_2}, G = \frac{Z_1}{Z_1^2 + Z_2^2},$$

wherein f represents a virtual alternating current measurement frequency, R represents the measured resistance value, and the meaning of the virtual impedance characteristic quantities is as follows: Y: calculated virtual admittance modulus, G: calculated real component modulus of the virtual admittance, Z: calculated virtual impedance modulus, $Z_1$: calculated real component modulus of the virtual impedance, $Z_2$: calculated imaginary component modulus of the virtual impedance, $Y_1$: reciprocal of the calculated real component modulus of the virtual impedance, $Y_2$: reciprocal of the imaginary component modulus of the virtual impedance, phase: calculated virtual phase, and P: reciprocal of the calculated virtual phase;
    combining measurement parameters of virtual frequencies in a first predetermined range and virtual parallel capacitance values in a second predetermined range, and measuring a certain type of gas with known concentration at each virtual impedance characteristic quantity among the above nine virtual impedance characteristic quantities in the case of each combination;
    obtaining a characteristic value corresponding to the known concentration at a certain virtual impedance characteristic quantity among the currently selected nine virtual impedance characteristic quantities at the end of each time of measurement;
    obtaining multiple characteristic values corresponding to the same gas concentration at each virtual impedance characteristic quantity after traversing all parameter combinations and all nine virtual impedance characteristic quantities;
    when considering the linearity and the signal-to-noise ratio between each characteristic value at all virtual impedance characteristic quantities and the known concentration, and making the linearity greater than or equal to a first threshold and the signal-to-noise ratio greater than or equal to a second threshold:
    selecting a frequency range composed of corresponding virtual frequency values as a third range of measurement frequencies, wherein the lower limit of the third range is the minimum frequency among the corresponding virtual frequency values, and the upper limit of the third range is the maximum frequency among the corresponding virtual frequency values, and
    selecting a capacitance range composed of corresponding virtual parallel capacitance values as a fourth range of parallel capacitance values, wherein the lower limit of the fourth range is the minimum capacitance value among the corresponding virtual parallel capacitance values, and the upper limit of the fourth range is the maximum capacitance value among the corresponding virtual parallel capacitance values,
    selecting one or several corresponding virtual impedance characteristic quantities, and
    taking the selected virtual measurement frequencies in the third range, the selected virtual parallel capacitance values in the fourth range and the selected one or several corresponding virtual impedance characteristic quantities as the finally selected measurement parameters for measuring the unknown gas concentration; and
    third step, measuring the type of gas with unknown concentration based on the measurement parameters.

2. The method according to claim 1, wherein preferably, the step of considering the linearity and the signal-to-noise ratio between each characteristic value at all virtual impedance characteristic quantities and the known concentration, and making the linearity greater than or equal to a first threshold and the signal-to-noise ratio greater than or equal to a second threshold comprises the conditions:
    1) Firstly selecting all the characteristic values with the linearity being greater than or equal to the first threshold, and each corresponding virtual impedance characteristic quantity; and
    then further selecting those characteristic values with the signal-to-noise ratio being greater than or equal to the second threshold from all the characteristic values, and each corresponding virtual impedance characteristic quantity; or
    2) Firstly selecting all the characteristic values with the signal-to-noise ratio being greater than or equal to the second threshold, and each corresponding virtual impedance characteristic quantity; and
    then further selecting those characteristic values with the linearity being greater than or equal to the first threshold from all the characteristic values, and each corresponding virtual impedance characteristic quantity.

3. The method according to claim 1, wherein in the first step, the semiconductor gas sensor comprises a metal oxide gas sensor or a semiconductor gas sensor prepared based on dielectric polymers, conductive polymers, nanotubes, metal organic frameworks, graphene and supramolecular compounds.

4. The method according to claim 1, wherein in the second step, the first predetermined range comprises real numbers greater than zero, and the second predetermined range comprises real numbers greater than zero.

5. The method according to claim 1, wherein in the second step, the first predetermined range is 1 Hz to 10 MHz, and the second predetermined range is 1 pF to 1 uF.

* * * * *